(12) United States Patent
Okada et al.

(10) Patent No.: US 9,272,462 B2
(45) Date of Patent: Mar. 1, 2016

(54) MINUTE CONVEXO-CONCAVE PATTERN FORMING METHOD AND FORMING DEVICE, AND TRANSFER SUBSTRATE PRODUCING METHOD AND TRANSFER SUBSTRATE

(75) Inventors: Shinichiro Okada, Minami-Ashigara (JP); Shotaro Ogawa, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 721 days.

(21) Appl. No.: 13/636,253

(22) PCT Filed: Mar. 24, 2011

(86) PCT No.: PCT/JP2011/057178
§ 371 (c)(1),
(2), (4) Date: Oct. 11, 2012

(87) PCT Pub. No.: WO2011/122439
PCT Pub. Date: Oct. 6, 2011

(65) Prior Publication Data
US 2013/0207309 A1 Aug. 15, 2013

(30) Foreign Application Priority Data

Mar. 29, 2010 (JP) .................................. 2010-075495

(51) Int. Cl.
*B29C 33/42* (2006.01)
*H01L 21/683* (2006.01)
(Continued)

(52) U.S. Cl.
CPC .............. *B29C 59/002* (2013.01); *B29C 33/424* (2013.01); *B29C 33/44* (2013.01);
(Continued)

(58) Field of Classification Search
CPC ........ B29C 33/34; B29C 33/44; B29C 33/42; B29C 59/0002; B82Y 40/00; B82Y 10/00; G03F 7/0002; H01L 21/02; H01L 21/67; H01L 21/6838; Y10T 156/1002; Y10T 156/1041; Y10T 156/103; Y10T 156/1043; Y10T 156/14; Y10T 156/1195; Y10T 156/1928; Y10T 156/1944; Y10T 156/1994

See application file for complete search history.

(56) References Cited

U.S. PATENT DOCUMENTS 6,740,265 B2   5/2004   Matsumoto et al.
7,636,999 B2  12/2009   Choi et al.
(Continued)

FOREIGN PATENT DOCUMENTS

EP   1 843 884       10/2007
JP   2002-172626      6/2002
(Continued)

OTHER PUBLICATIONS

International Search Report, PCT/JP2011/057178, Apr. 26, 2011.
(Continued)

*Primary Examiner* — Linda L Gray
(74) *Attorney, Agent, or Firm* — Young & Thompson

(57) ABSTRACT

A minute convexo-concave pattern forming method includes: transferring a minute convexo-concave pattern of a mold to a resist layer of a transfer substrate where a resist layer is formed on a substrate and curing the transferred minute convexo-concave pattern; and after curing the transferred minute convexo-concave pattern, peeling the transfer substrate and the mold, the peeling step including: pressurizing a substrate back surface side of the transfer substrate with a peripheral part of the transfer substrate being fixed to bend the transfer substrate in a curved shape and starting peeling of the transfer substrate and the mold with a bending of the transfer substrate; and peeling a part of the minute convexo-concave pattern of the transfer substrate not peeled in the first peeling step by gradually decreasing a pressure for a pressurization so as to undo the bending of the transfer substrate.

15 Claims, 14 Drawing Sheets

(51) Int. Cl.
   *B29C 59/00*     (2006.01)
   *B29C 33/44*     (2006.01)
   *B82Y 10/00*     (2011.01)
   *B82Y 40/00*     (2011.01)
   *G03F 7/00*      (2006.01)

(52) U.S. Cl.
   CPC ............... *B82Y 10/00* (2013.01); *B82Y 40/00* (2013.01); *G03F 7/0002* (2013.01); *B29C 33/42* (2013.01); *H01L 21/6838* (2013.01); *Y10T 156/1195* (2015.01); *Y10T 156/1928* (2015.01); *Y10T 156/1994* (2015.01)

(56) References Cited

U.S. PATENT DOCUMENTS

| | | |
|---|---|---|
| 7,785,091 B2 | 8/2010 | Kasumi et al. |
| 7,906,058 B2 | 3/2011 | GanapathiSubramanian et al. |
| 2002/0070468 A1 | 6/2002 | Matsumoto et al. |
| 2006/0172031 A1 | 8/2006 | Babbs et al. |
| 2006/0172549 A1 | 8/2006 | Choi et al. |
| 2006/0172553 A1 | 8/2006 | Choi et al. |
| 2007/0126150 A1 | 6/2007 | GanapathiSubramanian et al. |
| 2007/0190200 A1 | 8/2007 | Cherala et al. |
| 2007/0243279 A1 | 10/2007 | McMackin et al. |
| 2008/0093339 A1 | 4/2008 | Kasumi et al. |
| 2010/0059914 A1 | 3/2010 | Cherala et al. |

FOREIGN PATENT DOCUMENTS

| | | |
|---|---|---|
| JP | 2007-083626 | 4/2007 |
| JP | 2007-296683 | 11/2007 |
| JP | 2007-329367 | 12/2007 |
| JP | 2008-529826 | 8/2008 |
| JP | 2008-532263 | 8/2008 |
| JP | 2008-537513 | 9/2008 |
| JP | 2009-517882 | 4/2009 |
| JP | 2010-283108 | 12/2010 |
| KR | 1020070102723 | 10/2007 |
| WO | WO 2006/083518 | 8/2006 |
| WO | WO 2006/083519 | 8/2006 |
| WO | WO 2006-083520 | 8/2006 |

OTHER PUBLICATIONS

International Preliminary Report on Patentability—PCT/JP2011/057178—Oct. 2, 2012.
International Preliminary Report on Patentability—PCT/JP2011/057178—Oct. 23, 2012.
Korean Office Action dated Oct. 28, 2015, with English Translation; Application No. 10-2012-7025624.

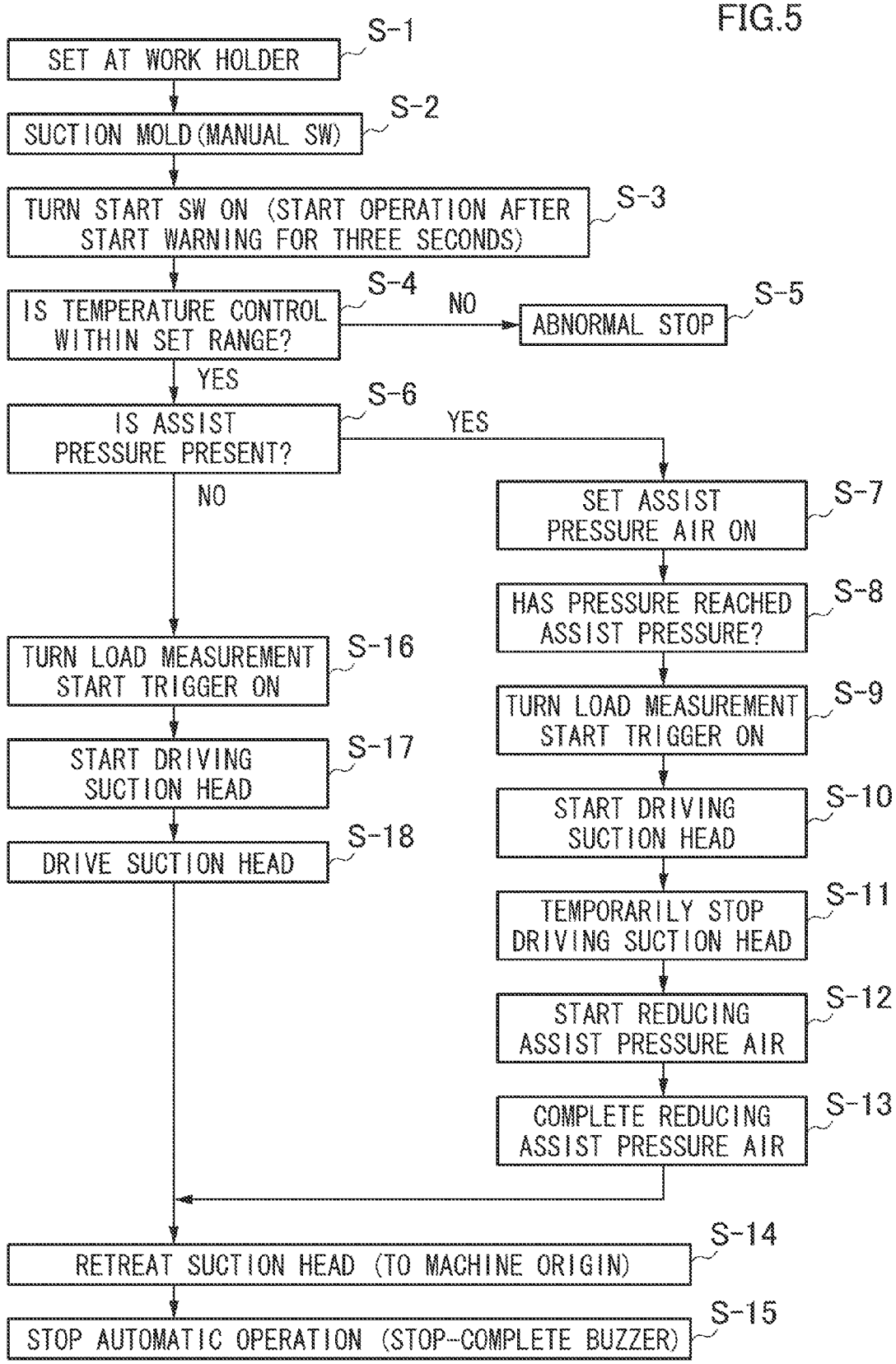

MINUTE CONVEXO-CONCAVE PATTERN FORMING METHOD AND FORMING DEVICE, AND TRANSFER SUBSTRATE PRODUCING METHOD AND TRANSFER SUBSTRATE

TECHNICAL FIELD

The present invention relates to a minute convexo-concave pattern forming method and forming device, and transfer substrate manufacturing method and transfer substrate and, in particular, to a peeling technology for peeling a resist layer after transfer from a mold without damaging a minute convexo-concave pattern.

BACKGROUND ART

In recent years, in a lithography process in semiconductor manufacture, to achieve a high speed and high integration of an integrated circuit, a technology using ultraviolet rays (KrF, ArF, or $F_2$ laser) in an exposure process has been developed. In recent years, a technology using EUV light (extreme ultraviolet light) with a shorter wavelength has been developed, but an apparatus using EUV light has a problem of high apparatus cost and others.

Moreover, in the conventional electron beam exposure technology used for micro-patterning so far, long-time exposure is required. For this reason, under the present circumstances, the electron beam exposure technology is used only for prototyping a small number of semiconductors for a special use purpose, posing a problem such that this technology cannot be applied to mass production of semiconductors.

As a method of solving both of these problems (apparatus cost and throughput), a nano imprint technology has attracted attention, in which a minute convexo-concave pattern in a nano size is formed on a substrate by using a polymer as a material to manufacture a high-functionality device such as a semiconductor, a recording medium, or an optical element.

A nano imprint scheme is a method of pressing a substrate coated with a resist (a resin material) onto a mold (a form) having a minute convexo-concave pattern formed thereon by electron beam exposure to transfer the minute convexo-concave pattern of the mold to a resist layer.

The nano imprint technology has features such that apparatus cost by microfabrication is inexpensive compared with the EUV scheme or the like and minute convexo-concave pattern shape in a size of several tens of nanometers can be transferred.

However, the nano imprint technology has a faulty peel problem in which when the resist layer and the mold are peeled after a minute convexo-concave pattern is transferred to the resist layer on the substrate, the minute convexo-concave pattern transferred to the resist layer tends to be damaged. This is because the nano imprint technology includes a transferring process of bringing the mold and the resist layer into contact with each other to form a minute convexo-concave pattern, and the faulty peel problem is a fundamental problem unavoidable due to the transferring process mentioned above.

Several measures have been suggested so far to mitigate this faulty peel problem. For example, PTL 1 discloses a pattern forming method in which an angle formed between a direction of a line of a convexo-concave pattern and a mold peeling direction is adjusted to prevent the convexo-concave pattern from being damaged at the time of peeling.

Also, PTL 2 describes a method of forming a sufficient deformation adjacently to the mold so as to produce a resilient force larger than a bonding force between an imprinting material and the mold. This is thought to improve an imprinting method for use in a contact lithography process.

Furthermore, PTL 3 discloses a device manufacturing method in which, with the mold and the resin being in contact with each other, a state from the time when the mold starts moving in a direction of going away from the resin to the time of peeling is divided into a first state and a second state and a load change ratio acted between the mold and resin in the second state is set smaller than that in the first state. With this, it is thought to be able to achieve a high-speed releasing process and an excellent throughput.

CITATION LIST

Patent Literature

PTL 1: Japanese Patent Application Laid-Open No. 2007-296683

PTL 2: Published Japanese Translations of PCT International Publication for Patent Applications No. 2009-517882

PTL 3: Japanese Patent Application Laid-Open No. 2007-329367

SUMMARY OF INVENTION

Technical Problem

However, even if any of the peeling methods of PTLs 1 to 3 is adopted, the faulty peel problem cannot essentially be solved. In particular, the minute convexo-concave pattern cannot be prevented from being damaged or deformed at the peel final end immediately before the peeling of the mold and the transfer substrate ends.

The present invention was made in view of these circumstances, and has an object of providing a minute convexo-concave pattern forming method and forming device, and transfer substrate manufacturing method and transfer substrate allowing formation of a highly-accurate minute convexo-concave pattern even in a nano size because the minute convexo-concave pattern transferred to the resist layer of the transfer substrate can be effectively prevented from being damaged when the mold on a side of transferring the minute convexo-concave pattern and the transfer substrate on a transferred side are peeled.

Solution to Problems

To achieve the object described above, a minute convexo-concave pattern forming method according to a first aspect of the present invention includes: a transferring step of transferring a minute convexo-concave pattern of a mold to a resist layer of a transfer substrate where the resist layer is formed on the substrate and curing the transferred minute convexo-concave pattern; and a peeling step of peeling the transfer substrate and the mold after curing the transferred minute convexo-concave pattern, and the peeling step includes: a first peeling step of pressurizing a substrate back surface side of the transfer substrate with a peripheral part of the transfer substrate being fixed to bend the transfer substrate in a curved shape and starting peeling of the transfer substrate and the mold with the bending of the transfer substrate; and a second peeling step of peeling a part of the minute convexo-concave pattern of the transfer substrate not peeled in the first peeling step by gradually decreasing a pressure for a pressurization so as to undo bending of the transfer substrate.

According to the minute convexo-concave pattern forming method in accordance with the first aspect, in the first peeling step, by pressurizing the substrate back surface side with the peripheral part of the transfer substrate being fixed to bend the transfer substrate in a curved shape, at a mold outer peripheral end, a peel angle with respect to the mold can be provided to the transfer substrate. With this, the minute convexo-concave pattern on the outer peripheral part of the transfer substrate is first peeled by using the bending.

Next, in the second peeling step, the pressure for the pressurization on the substrate back surface side is gradually decreased to act a bending resilient force on the transfer substrate. With this, a peel force is provided toward a center part of the transfer substrate so that the transfer substrate bent in a curved shape becomes in a flat plate shape, and therefore the minute convexo-concave pattern of the center part of the transfer substrate not peeled in the first peeling step is peeled.

That is, while the bending resilient force occurs at the stage where the transfer substrate starts to be bent by pressurization, the pressurizing force is larger than the bending resilient force at this stage, and therefore bending increases. By using this bending, the minute convexo-concave pattern of the outer peripheral part of the transfer substrate is peeled (the first peeling step). Then, the pressurizing force is gradually decreased, and when the bending resilient force becomes larger than the pressurizing force, the bending decreases and the substrate goes in a direction in which the bending is undone. By using this bending undone, the minute convexo-concave pattern of the center part of the transfer substrate not peeled in the first peeling step is peeled (the second peeling step).

Here, immediately before the second peeling step ends, the minute convexo-concave pattern of a peel final end (a center of the transfer substrate) is coupled to the mold. Therefore, if a large bending resilient force (peel force) is provided at a dash when peeling is completed, the minute convexo-concave pattern of the peel final end may be broken or deformed.

However, in the present aspect, the pressure for the pressurization on the transfer substrate is gradually decreased to gradually act the bending resilient force (peel force) on the transfer substrate, thereby peeling with a small peel force at a slow peeling speed. With this, in the second peeling step, the minute convexo-concave pattern of the center part of the transfer substrate, in particular, the minute convexo-concave pattern at the peel final end, is prevented from being damaged or deformed.

With this, peeling can be made so that the minute convexo-concave pattern transferred to the resist layer of the transfer substrate is not damaged. Therefore, a highly-accurate minute convexo-concave pattern even in a nano size can be formed.

In the minute convexo-concave pattern forming method according to the aspect described above, in the first peeling step, the transfer substrate is preferably bent to an amount less than a maximum bending amount (a second aspect). With this, the minute convexo-concave pattern at the peel final end where the minute convexo-concave pattern tends to be damaged can be peeled in the second peeling step capable of peeling with a small peel force at a slow peeling speed.

Here, the maximum bending amount refers to a bending amount of the transfer substrate when a pressurizing force is applied in the state of a transfer substrate carrier. In the first peeling step, the conditions are such that a bending amount is provided so that the minute convexo-concave pattern formed on the outer peripheral part of the transfer substrate can be peeled from the mold with the bending of the transfer substrate and, when a bending resilient force is acted on the transfer substrate, the entire minute convexo-concave pattern formed on the center part of the transfer substrate can be peeled from the mold with the bending resilient force.

In the minute convexo-concave pattern forming method according to the aspect described above, in the first peeling step, the mold is preferably moved according to the bending of the transfer substrate in a direction in which the mold goes away from the transfer substrate (a third aspect). In this case, the mold may be slid so as to follow the bending force of the transfer substrate, or the mold may be forcibly moved by a driving device by a predetermined amount. With this, the peel force by bending can be uniformly applied to the transfer substrate, and therefore the minute convexo-concave pattern of the outer peripheral part of the transfer substrate can be uniformly applied. In particular, by forcibly moving the mold by the driving device by the predetermined amount, the bending of the transfer substrate by pressurizing on the substrate back surface side can be assisted, thereby achieving smooth bending.

In the minute convexo-concave pattern forming method according to the aspect described above, in the second peeling step, a pressurizing force on the substrate back surface side is preferably gradually decreased, with the mold being fixed so as not to move (a fourth aspect). With this, only the bending resilient force is acted as a peel force, and therefore peeling can be performed with a small peel force without instantaneously increasing the peeling speed at the peel final end.

In the minute convexo-concave pattern forming method according to the aspect described above, when a sufficient peel force cannot be obtained in the second peeling step if only the bending resilient force is acted as the peel force, in the second peeling step, the pressurizing force on the substrate back surface side is preferably gradually decreased while the mold is being moved in the direction in which the mold goes away from the transfer substrate continuously from the movement in the first peeling step (a fifth aspect).

In this case, the movement of the mold is preferably extremely slow at 0.1 mm/second or less.

In the minute convexo-concave pattern forming method according to the aspect described above, in the second peeling step, the mold is preferably peeled with a pressurizing pressure on the substrate back surface side being kept, while the mold is being moved in the direction in which the mold goes away from the transfer substrate continuously from the movement in the first peeling step (a sixth aspect).

In the minute convexo-concave pattern forming method according to the aspect described above, in the first and second peeling steps, a load applied to the transfer substrate is preferably measured, and the pressurizing force is preferably controlled based on the measured load (a seventh aspect). With this, peeling can be performed while the peel force is accurately grasped.

Also, as a method of controlling the pressure for pressurization on the substrate back surface side without using a load cell, there are a case of controlling based on an elapsed time from the start of the pressurization (an eighth aspect), a case of controlling based on a movement amount of the mold from the start of the pressurization (a ninth aspect), and a case of controlling based on a bending amount of the transfer substrate from the start of the pressurization (a tenth embodiment).

In these cases, it is required to find, in advance with a preliminary test or the like, a relation between the elapsed time and the pressurizing force, a relation between the movement amount of the mold and the pressurizing force, and a relation between the bending amount of the transfer substrate and the pressurizing amount.

To achieve the object described above, a minute convexo-concave pattern forming apparatus according to an eleventh aspect of the present invention includes a peeling device which, after transferring and curing a minute convexo-concave pattern of a mold to a resist layer of a transfer substrate where a resist layer is formed on the substrate, peels the transfer substrate and the mold, and the peeling device includes: a peripheral part fixing member which fixes a peripheral part of the transfer substrate; a pressurizing part which pressurizes a substrate back surface side of the transfer substrate with the peripheral part of the transfer substrate being fixed to bend the transfer substrate in a curved shape; and a pressure control part which gradually decreases a pressure for a pressurization so as to undo the bending of the transfer substrate.

In the eleventh aspect described above, the present invention is configured as an apparatus.

The minute convexo-concave pattern forming apparatus according to the above described aspect preferably includes a moving and driving part which moves the mold in a direction in which the mold goes away from the transfer substrate (a twelfth aspect). However, in the present invention, not only a forcible movement by the moving and driving part but also a so-called following movement without the moving and driving part is possible, in which the mold is moved in the direction in which the mold goes away from the transfer substrate by the bending force with which the transfer substrate is bent.

Furthermore, the moving and driving part preferably includes a lock mechanism which locks the movement of the mold (a thirteenth aspect). Still further, a load sensor which measures a load applied to the transfer substrate is preferably provided (a fourteenth aspect).

These correspond to the case in which the moving and driving part which moves and drives the mold is provided. According to the twelfth to fourteenth aspects described above, with the provision of the moving and driving part, the mold can be accurately moved.

To achieve the object described above, in a method of manufacturing a transfer substrate, by using the minute convexo-concave pattern forming method according to any one of the first to tenth aspects, the minute convexo-concave pattern of the mold is transferred to the transfer substrate, and then the mold is peeled away from the transfer substrate.

To achieve the object described above, a transfer substrate of a sixteenth aspect of the present invention is manufactured by using the minute convexo-concave pattern forming method according to any one of the first to tenth aspects to peel the minute convexo-concave pattern.

Since the transfer substrate described above is manufactured by using the minute convexo-concave pattern forming method according to any one of the first to tenth aspects, a highly-accurate minute convexo-concave pattern even in a nano size can be formed.

Advantageous Effects of Invention

According to the minute convexo-concave pattern forming method and device in accordance with each of the above described aspects, when the mold on a side of transferring the minute convexo-concave pattern and the transfer substrate on a transferred side are peeled, the minute convexo-concave pattern transferred to the resist layer of the transfer substrate can be effectively prevented from being damaged. Therefore, a highly-accurate minute convexo-concave pattern even in a nano size can be formed. In particular, the minute convexo-concave pattern can be prevented from being damaged or deformed at the peel final end immediately before the peeling of the mold and the transfer substrate ends.

BRIEF DESCRIPTION OF DRAWINGS

FIG. 5 is a flowchart of processes of a peeling method in the present invention and a general peeling method;

DESCRIPTION OF EMBODIMENTS

Preferred embodiments of a minute convexo-concave pattern forming method and forming device of the present invention are described in detail according to the attached drawings.

Each nano imprint process, a peeling process, and a peeling device to which the minute convexo-concave pattern forming method of the present invention is applied are described.

<Manufacture of Mold>

Figure 1A:
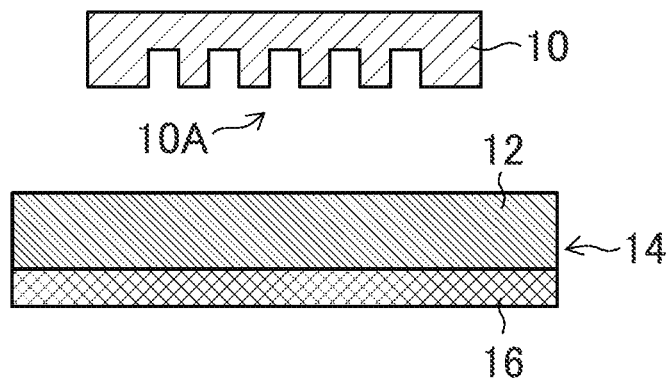
FIG. 1A is a process diagram of a nano imprint step of transferring a macro-convexo-concave pattern.

A metal material is subjected to a three-dimensional stereoscopic process by using a semiconductor microfabrication technology to form a mold (a form) 10 including a minute convexo-concave pattern as illustrated in FIG. 1A. In this case, an original plate may be formed by performing a molding process on a metal material, a pattern formed on the surface of the original plate may be transferred to a resin material to fabricate a rein stamper, and this stamper may be used as the mold 10. As a material of the mold 10, any can be selected as appropriate according to the object, and a metal, quartz, resin, or the like can be suitably used. As a metal material, Ni, Si or $SiO_2$, Cu, Cr, Pt, or the like can be used, and, as a resin material, polyethylene terephthalate, polyethylene naphthalate, polycarbonate, fluororesin, or the like can be used.

Then, a surface of a minute convexo-concave pattern 10A of the fabricated mold 10 is preferably coated with a release layer. The release layer is preferably formed on the surface of the minute convexo-concave pattern 10A so that peeling can be made so as to prevent a failure due to stress at the time of peeling on a transfer interface between the mold 10 and a resist layer 12 after transferring and curing processes, which will be described further below. As a material of the release layer, any material can be selected as appropriate as long as the material is suitable for the purpose of being easily attached and coupled to a mold 10 side and being less prone to be suctioned to a resist layer 12 side. Among others, in view of being less prone to be suctioned to the resist layer 12 side, a fluorine-based resin having a low electronegativity is preferable.

The thickness of the release layer is preferably made as thin as possible because a too high thickness changes the minute convexo-concave pattern 10A, and, specifically, the thickness is preferably 5 nm or less, and more preferably 3 nm or less.

As a method of forming a release layer, coating or vapor deposition of the material of the release layer can be applied. Furthermore, after the release layer is formed, it is preferable to increase adhesiveness to the mold 10 by baking or the like to improve the strength of the release layer itself.

By using the mold 10 manufactured as described above, a coating process, a transferring process, and a peeling process are performed to form a minute convexo-concave pattern 12A on the resist layer 12 of a transfer substrate 14.

[Coating Process]

As illustrated in FIG. 1A, a substrate 16 is coated with a resist fluid obtained by dissolving a resin material forming the resist layer 12 in a solvent to form the transfer substrate 14 having the resist layer 12 formed on the substrate 16. As a resin material forming the resist layer 12, for example, a thermoplastic resin, thermosetting resin, and photo-curable resin can be preferably used. Also, as a material of the substrate 16, for example, a glass substrate, Si substrate, or the like can be used.

As a method of coating the substrate 16 with the resist fluid, any of the following methods can be suitably used.

(1) The resist fluid is dropped by a dropping device such as an ink jet to an appropriate location on the substrate 16, and is spread with fluidity of the resist fluid itself to be applied uniformly onto the substrate 16.

(2) With spin coating, the substrate 16 is rotated to spread the resist fluid dropped onto the substrate 16 for uniform coating.

(3) By using a bar coater, the resist fluid is applied uniformly onto the substrate 16.

The thickness of the resist layer 12 with which the substrate 16 is coated can be measured with, for example, an optical measurement method using an ellipsometer or the like or a stylus-type contact measurement scheme using a step gauge, an atom force microscope (AFM), or the like.

[Transfer Process]

Figure 1B:
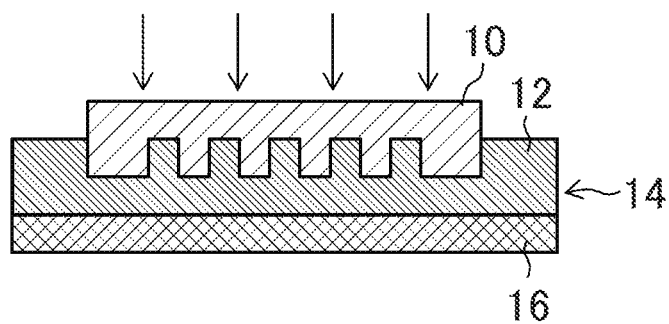
FIG. 1B is a process diagram of a nano imprint step of transferring the macro-convexo-concave pattern.

Next, as illustrated in FIG. 1B, the minute convexo-concave pattern 10A of the mold 10 is transferred to the resist layer 12 of the transfer substrate 14. In general, only with a weight of the mold 10 placed on the resist layer 12 of the transfer substrate 14, recessed parts of the minute convexo-concave pattern 10A formed on the mold 10 are not filled with the resist fluid of the resist layer 12, and therefore the pattern is not transferred. Thus, to transfer the minute convexo-concave pattern 10A of the mold 10 to the resist layer 12 of the transfer substrate 14, it is required to change surrounding pressure conditions for forcible filling. For example, the following filling methods (1) to (2) can be suitably used.

(1) The mold 10 is pressurized toward the resist layer 12 by a pressing machine or the like. In this case, by pressurizing or heating the resist layer 12, the recessed parts of the minute convexo-concave pattern 10A can be more easily filled with the resist fluid.

(2) After the substrate 16 is coated with the resist fluid, the mold 10 is placed on the resist layer 12 to be under a heating and pressure-reducing conditions. With this, air and air bubbles left in recessed parts of the minute convexo-concave pattern 10A are removed, and thus the recessed parts are filled with the resist fluid.

[Curing Process]

Figure 2A:
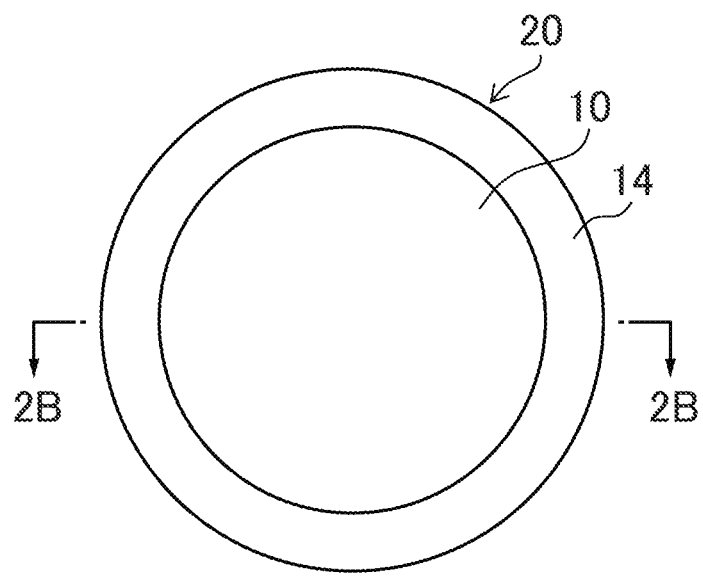
FIG. 2A is an upper surface view of a combined body (work) obtained by a mold and a transfer substrate together in a transferring step.
Figure 2B:
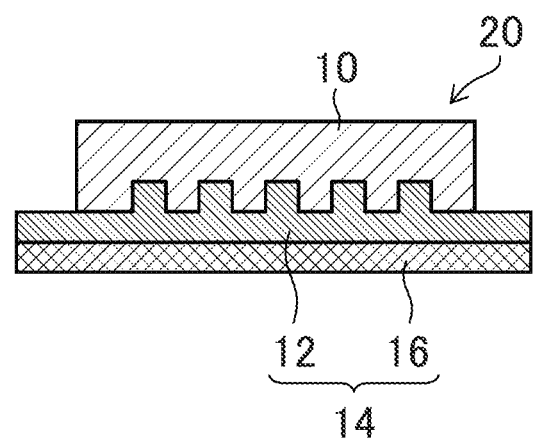
FIG. 2B is a sectional view along 2B-2B of FIG. 2A.

Next, the resist layer 12 having the minute convexo-concave pattern 10A of the mold 10 transferred thereto is cured. With this, as illustrated in FIG. 2A and FIG. 2B, a combined body 20 (hereinafter referred to as a "work 20") obtained by combining the mold 10 and the transfer substrate 14 is formed. FIG. 2A is an upper surface view of the work 20, and FIG. 2B is a sectional view along 2B-2B of FIG. 2A. Note that while the work 20 is in a circular shape in the present embodiment, this is not meant to be restrictive, and the work may be in a rectangular shape, for example.

As a method of curing the resist layer 12, any of the following methods (1) to (3) can be suitably used.

(1) In the case of a photo-curable resin, curing light having a wavelength band with which a curing initiator reacts is applied to the resist layer 12 for curing. FIG. 1B illustrates an example in which the resist layer 12 is cured by applying curing light from the back surface of the transparent mold 10 allowing passage of light.

(2) In the case of a solvent-soluble resist material, the material is dissolved in a solvent and is dried for curing after transferring.

(3) In the case of a thermoplasticity natural high polymer, the resist layer 12 is cured by being cooled after transfer.

[Peeling Process]

Figure 1C:
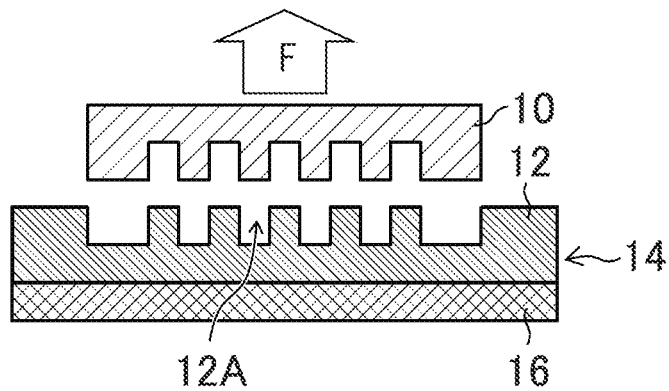
FIG. 1C is a process diagram of a nano imprint step of transferring the macro-convexo-concave pattern.

Next, as illustrated in FIG. 1C, the transfer substrate 14 and the mold 10 are peeled away from each other. FIG. 1C illustrates an example of a general tensile peeling method of peeling the mold 10 and the transfer substrate 14 by fixing the transfer substrate 14 and pulling the mold 10 in a vertical direction upward.

In this peeling process, conventionally, there is a problem in which the minute convexo-concave pattern 12A transferred to the resist layer 12 is damaged or deformed due to a peeling fault when the mold 10 is peeled from the transfer substrate 14. In particular, in the case of an extremely fine convexo-concave shape with the minute convexo-concave pattern in a nano size to be transferred, the degree of damage is large at a peel final end immediately before peeling of the mold 10 and the transfer substrate 14 is completed.

Thus, in the present embodiment, the problem described above is solved by performing, as a peeling process, a first peeling process of pressurizing a substrate back surface side of the transfer substrate 14 with a peripheral part of the transfer substrate 14 being fixed to bent the transfer substrate 14 in a curved shape, thereby starting peeling of the transfer substrate 14 and the mold 10; and a second peeling process of gradually decreasing a pressure for pressurization on the substrate back surface side to act a bending resilient force on the transfer substrate 14, thereby peeling a minute convexo-concave pattern 12A part of the minute convexo-concave pattern 12A of the transfer substrate 14 not peeled in the first peeling process.

A pressure for pressurization on the substrate back surface side of the transfer substrate 14 in the first and second peeling process described above is hereinafter referred to as an assist pressure.

In this case, in the first peeling process, with the transfer substrate 14 being bent in a curved shape, the mold 10 moves in a direction perpendicular to a substrate surface of the transfer substrate 14 before bending. This movement of the mold 10 may be made without using a moving and driving device for movement, and the mold 10 may be moved as following a bending force with which the transfer substrate 14 is bent. Alternatively, the movement may be made forcibly by a moving and driving device.

Figure 3A:
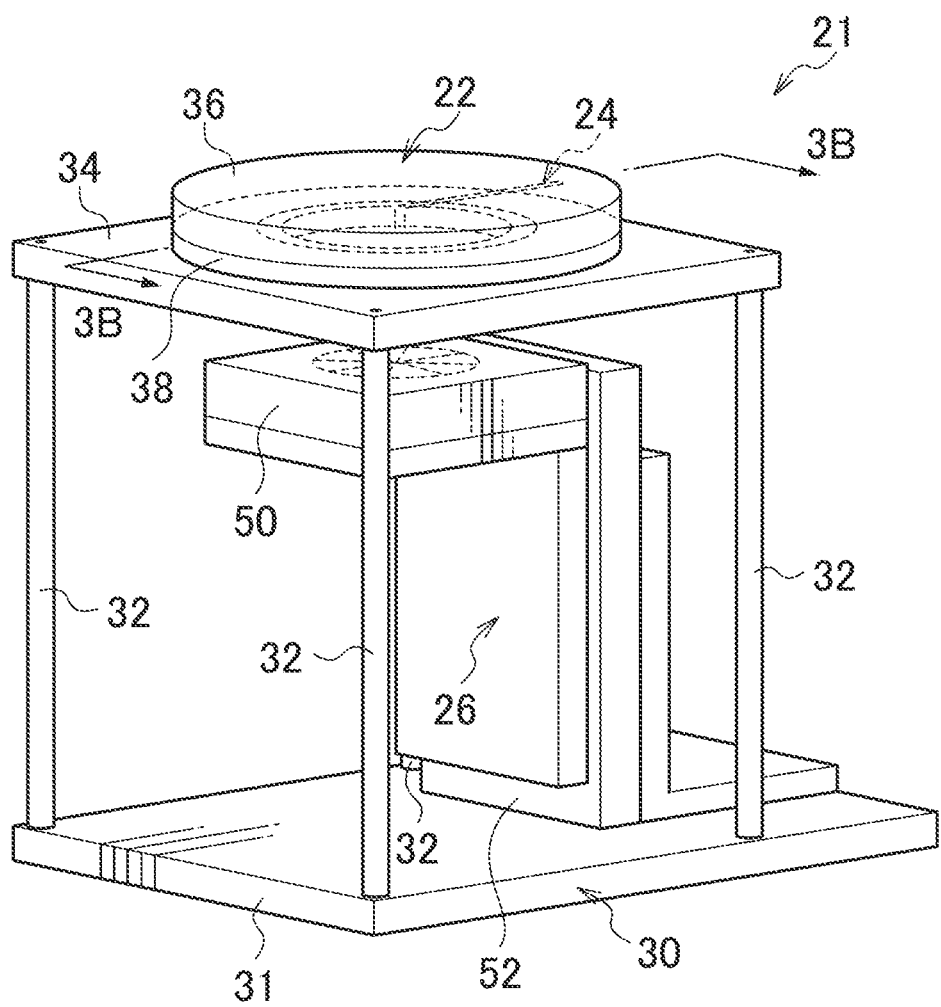
FIG. 3A is an entire structural view (a perspective view) for describing an example of a minute convexo-concave pattern forming apparatus of the present invention.
Figure 3B:
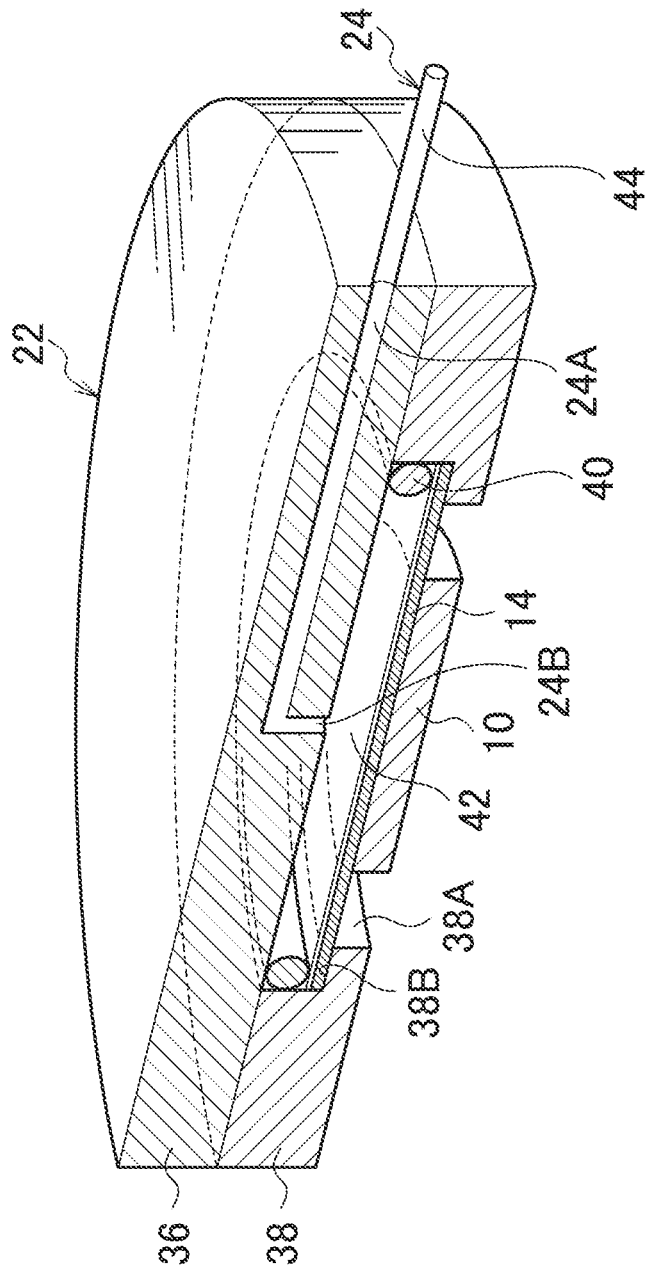
FIG. 3B is a drawing of a work holder portion of a minute convexo-concave pattern (a partial perspective cross sectional view along a 3B-3B line of FIG. 3A)

FIG. 3A is an entire structure view (a perspective view) illustrating an example of a peeling device 21 including a moving and driving device in the embodiment of the present invention, and FIG. 3B is a sectional view (a partial perspective cross sectional view along a 3B-3B line of FIG. 3A) illustrating the state in which the work 20 is set at a work holder 22.

As illustrated in FIGS. 3A and 3B, the peeling device 21 is configured to have the work holder 22, a pressurizing device 24, and a moving and driving device 26 assembled to a device frame 30.

In the device frame 30, struts 32, 32, ... stand respectively at four corners of a rectangular base 31, and a support plate 34 is provided to support the work holder 22 over the struts 32. At a center part of the support plate 34, a circular hole 34A (refer to FIG. 4) is formed, and the work holder 22 is supported on the support plate 34 so as to go across the circular hole 34A.

The work holder 22 mainly has a structure in combination of a disk-shaped upper plate 36 and a donut-shaped lower plate 38 having a circular hole 38A formed at a center part, and, around the circular hole 38A of the lower plate 38, a substrate receiving surface 38B receiving the transfer substrate 14 of the work 20 is formed. And, to perform the peeling process, the work 20 obtained by combining the mold 10 and the transfer substrate 14 is set at the work holder 22. In this case, the transfer substrate 14 is placed on the substrate receiving surface 38B with the mold 10 on a lower side and is then covered with the upper plate 36 so that an O ring 40 provided to an upper surface peripheral part of the transfer substrate 14 is crushed, thereby fixing the upper plate 36 and the lower plate 38 with a fixing member not illustrated. With this, the peripheral part of the transfer substrate 14 is fixed, and a pressurization space 42 in an airtight structure surrounded by an upper surface of the transfer substrate 14, a lower surface of the upper plate 36, and the O ring 40 is formed.

To this pressurization space 42, compressed air is blown by a pressurizing device 24. In the pressurizing device 24, a flow path 24A is formed inside the upper plate 36 to let compressed air flow to the pressurization space 42, and a blow port 24B at a tip of the flow path 24A is open to face the pressurization space 42. Also, the flow path 24A is connected with a piping 44 via a compression control mechanism 45 (refer to FIG. 4) to a compressor 47.

The pressure control mechanism 45 has two functions of adjusting an amount of compressed air to be supplied from the compressor 47 to the pressurizing device 24 to adjust the pressure in the pressurization space 42, and venting the compressed air from the pressurization space 42 to decrease the pressure of the pressurization space 42. And, when compressed air is supplied to the pressurization space 42, the substrate back surface side of the transfer substrate 14 is pressurized, and the transfer substrate 14 is bent in a curved shape (curved so as to project downward). Note that while the compressed air is supplied to the pressurization space 42 to bend the transfer substrate 14 in the present embodiment, a liquid can be supplied to the pressurization space 42. Also, a method with a structure other than that of supplying air or fluid to the pressurization space 42 can be applied. For example, a solid substance (not illustrated) having an abutting surface with a predetermined curvature and many suction holes on the abutting surface is provided on the substrate back surface side of the transfer substrate 14. And, the transfer substrate 14 may be curved by causing the abutting surface of this solid substance on the transfer substrate 14 for suctioning.

As described above, with the work 20 being set at the work holder 22, the lower surface of the mold 10 protrudes to a lower surface side of the support plate 34 via the circular hole 38A of the lower plate 38 and the circular hole 34A of the support plate 34. This lower surface of the mold 10 is suctioned by a suction head 50 of the moving and driving device 26, which will be described next.

The moving and driving device 26 includes the suction head 50 suctioning the lower surface of the mold 10 and an ascent/descent device 52 causing the suction head 50 to ascend or descend. Although a detailed structure of the ascent/descent device 52 is not illustrated in FIG. 3A, in peeling of the minute convexo-concave pattern in a nano size, it is enough for the suction head 50 to normally have an ascending/descending stroke of 10 mm, and any device can be used as long as the device is capable of precise ascent/descent control over the ascending/descending stroke to this degree.

Also, the moving and driving device 26 is provided with a load cell 54 (FIG. 4) measuring a load applied to the transfer substrate 14 when the compressed air is supplied to the pressurization space 42. That is, when compressed air is supplied to the pressurization space 42 to bend the transfer substrate 14 in a curved shape (curved so as to project downward), the load cell 54 is pressed by the bending force, and this pressure is measured by the load cell 54 as a load.

Figure 4:
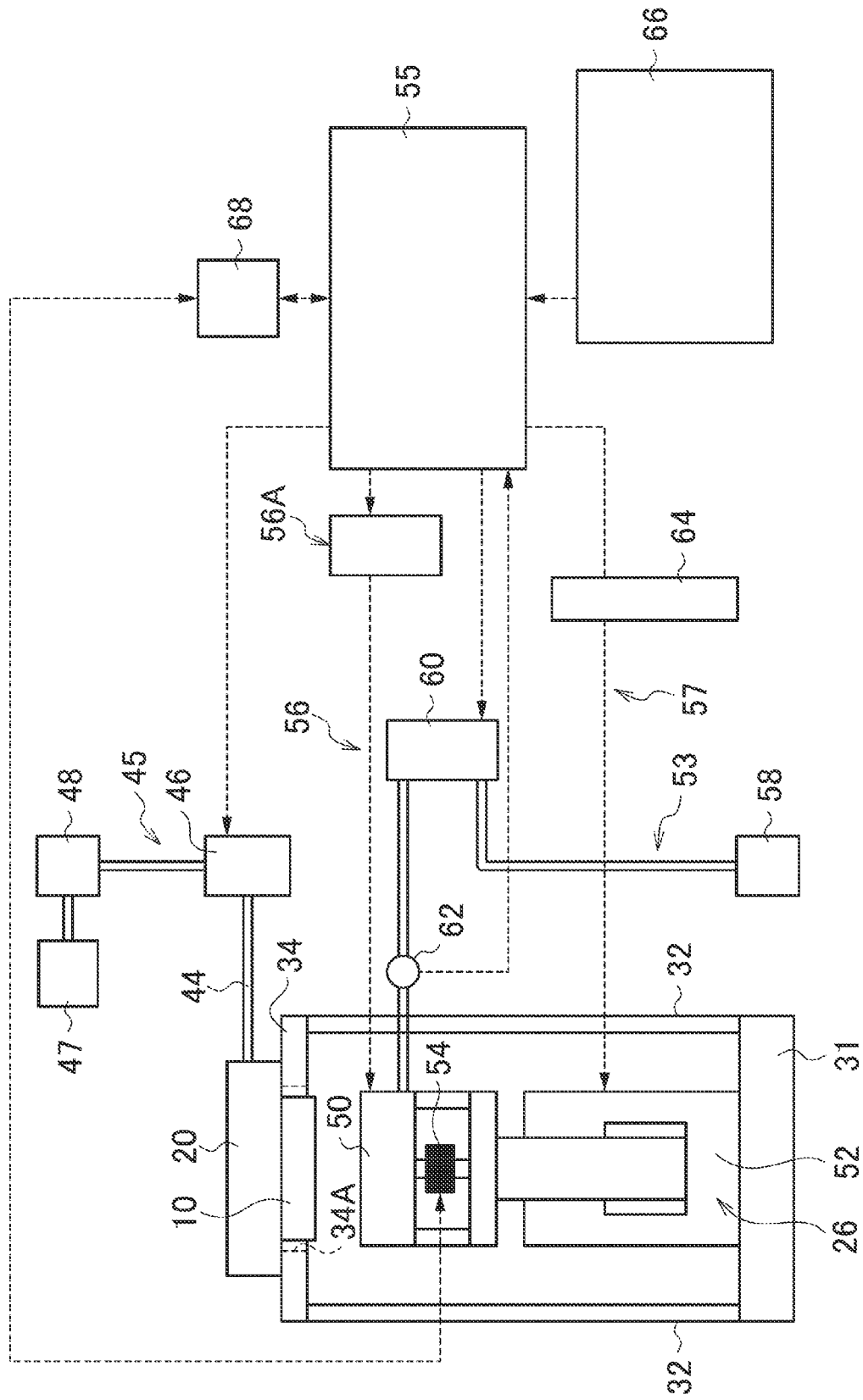
FIG. 4 is an explanatory diagram describing a control system of the minute convexo-concave pattern forming device.

FIG. 4 is a schematic view of the pressure control mechanism 45 for the pressurizing device 24, a suction control mechanism 53 for the suction head 50, a temperature control mechanism 56 for the suction head 50, and a movement control mechanism 57 for the moving and driving device 26.

As illustrated in FIG. 4, in the pressure control mechanism 45, the piping 44 connecting the compressor 47 and the blow port 24B inside the work holder 22 is provided with a solenoid valve 48 and an electro-pneumatic conversion regulator 46, and these devices are controlled by a sequencer 55 based on the load measured by the load cell 54.

The temperature control mechanism 56 is provided with a heater (not illustrated) incorporated in the suction head 50 and a temperature control device 56A adjusting a heater temperature. The temperature control device 56A feeds the temperature state back to the sequencer 55.

In the suction control mechanism 53, a vacuum flow path connecting the suction head 50 and a vacuum pump 58 is provided with a solenoid valve 60 and a pressure sensor 62, and the solenoid valve 60 is controlled by the sequencer 55.

The pressure sensor 62 is monitoring a vacuum achievement degree, and outputs to the sequencer 55 a signal indicating the presence or absence of suctioning. According to the output from the pressure sensor 62, the sequencer 55 performs control for detecting suction abnormality or starting a peeling operation.

The movement control mechanism 57 is provided with a driver 64 driving the ascent/descent device 52. The driver 64 is controlled by the sequencer 55 based on the load measured by the load cell 54.

Also, a touch panel 66 is connected to the sequencer 55, accepts inputs of various peeling condition parameters (such as a suction head driving speed, a driving stroke, and an assist pressure set value), accepts inputs of instructions for starting and stopping of the device, conducts an abnormal display, and performs others. Also, the load cell 54 is connected to the sequencer 55 via a load cell controller 68.

Next, a peeling method is described by using the above-described minute convexo-concave pattern peeling device 21.

FIG. 5 is a flowchart illustrating steps of the peeling method. Note that, as the peeling step of FIG. 5, a selection can be made from a peeling step to which the peeling method according to the embodiment described above and a peeling step by general tensile peeling.

As illustrated in FIG. 5, the work 20 is set at the work holder 22 (step S-1). Specifically, the transfer substrate 14 is placed on the substrate receiving surface 38B with the mold 10 on a lower side and is then covered with the upper plate 36 so that the O ring 40 (a peripheral part fixing member) provided to the upper surface peripheral part of the transfer substrate 14 is crushed, thereby fixing the upper plate 36 and the lower plate 38 with a fixing member (for example, a bolt and a nut) not illustrated. With this, the transfer substrate 14 is fixed to the support plate 34 of the device frame 30 via the work holder 22.

Next, "manual SW", which indicates an instruction for suctioning the mold, is turned ON on the touch panel 66 (step S-2), and the mold 10 is held by the suction head 50. Then, by turning a start switch ON, automatic sequence control starts, and a peeling step starts in sequence after a start warning sound is produced for three seconds (step S-3).

Next, it is checked whether the temperature of the suction head 50 is within a set range (step S-4), when the temperature is outside the set range (NO), the procedure goes to step S-5 for abnormal stop to stop the peeling device 21. When the temperature is within the set range (YES), the procedure goes to the next step S-6. The set temperature of the suction head 50 is preferably within a range from a room temperature (for example, 20 degrees Celsius) to 60 degrees Celsius. When the temperature is within the range from the room temperature (for example, 20 degrees Celsius) to 60 degrees Celsius, resilience of the transfer substrate 14 becomes larger, and therefore the minute convexo-concave pattern 12A of the transfer substrate 14 is less prone to be damaged when the transfer substrate 14 is bent in a curved shape. If the temperature exceeds 60 degrees Celsius, viscosity of the transfer substrate 14 is increased, and become less prone to be peeled.

At step S-6, the method with an assist pressure (YES) for peeling or the method without an assist pressure (NO) for peeling is selected based on a condition set in advance on the touch panel 66. To perform the peeling method according to the embodiment, YES is selected, and the procedure goes to the next step S-7.

At step S-7, an operation of sending compressed air to the pressurization space 42 of the work holder 22 is turned ON, thereby pressurizing the substrate back surface side of the transfer substrate 14. With this, a pressure to cause bending in a curved shape projecting downward occurs to the transfer substrate 14. However, at this moment, the suction head 50 is not moved yet, and therefore a compressed load is applied to the load cell 54. Then, it is determined by using a pressure sensor (not illustrated) on the piping 44 whether the assist pressure has reached a predetermined pressure (step S-8).

Here, a maximum bending amount L is a bending amount L of the transfer substrate 14 when an assist pressure P is applied in a state of a transfer substrate carrier. Stroke settings in the first peeling process are required to satisfy the following two conditions.

Figure 6A:
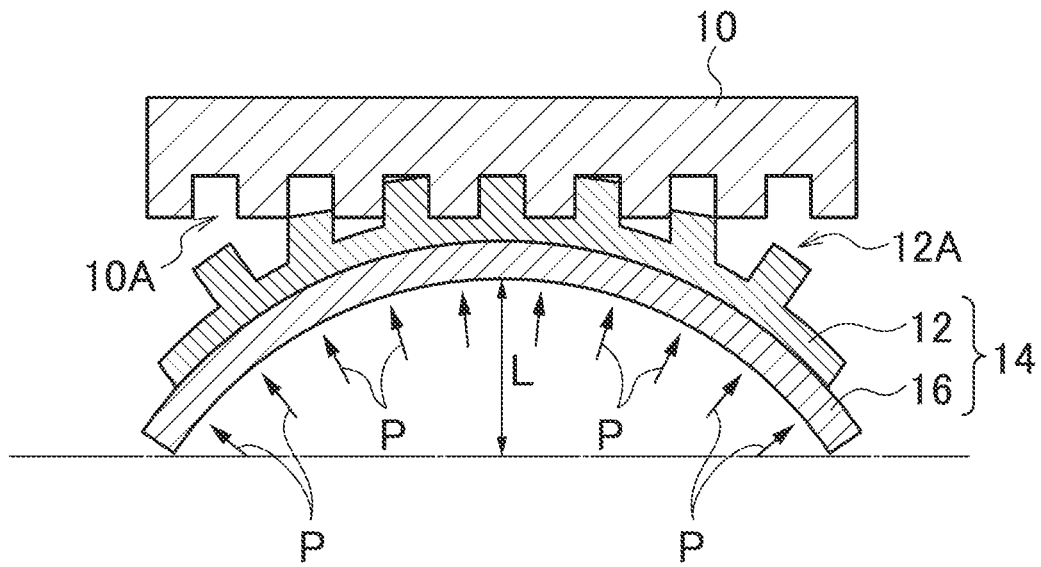
FIG. 6A is an explanatory diagram for describing a maximum bending amount.

That is, firstly, as illustrated in FIG. 6A, the minute convexo-concave pattern 12A formed on the outer peripheral part of the transfer substrate 14 due to bending of the transfer substrate 14 by the assist pressure P can be peeled away from the mold 10.

Figure 6B:
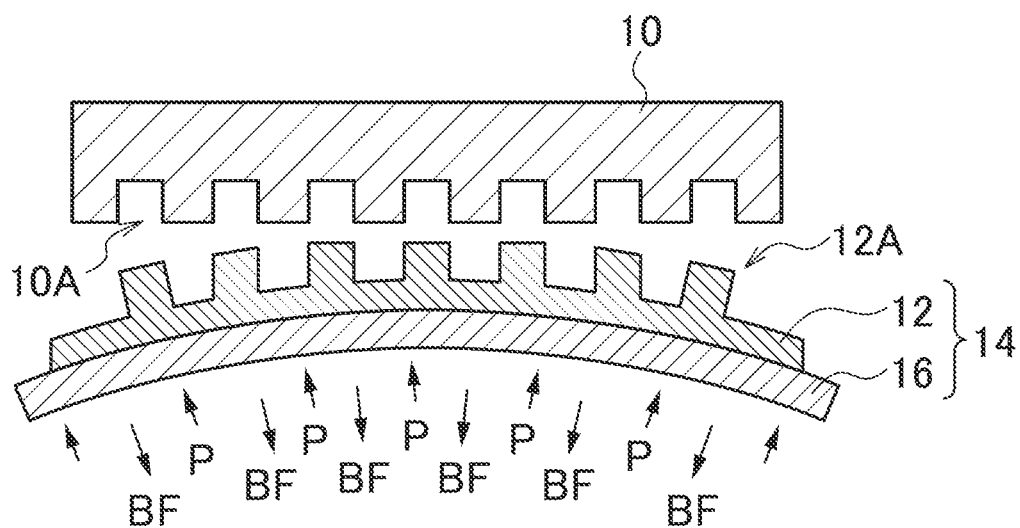
FIG. 6B is an explanatory diagram for describing a maximum bending amount.

Secondly, as illustrated in FIG. 6B, when the assist pressure P is decreased to act a bending resilient force BF on the transfer substrate 14, the entire minute convexo-concave pattern 12A formed at the center part of the transfer substrate 14 not peeled yet can be peeled away from the mold 10 by the bending resilient force BF.

Note that if the bending amount of the transfer substrate 14 is too large, a degree of interference of the three-dimensional minute convexo-concave pattern 10A formed on the mold 10 and the three-dimensional minute convexo-concave pattern 12A transferred to the transfer substrate 14 with each other at the time of peeling is increased. With this, the minute convexo-concave pattern 12A of the transfer substrate 14 may tend to be destroyed or deformed at the time of peeling. Therefore, the stroke settings in the first peeling process are preferably as small as possible within a range satisfying the condition of stroke settings in the first peeling process described above. For example, in the case of the transfer substrate 14 of 6 inches, the assist pressure is preferably in a range of 0.02 MPa to 0.03 MPa. If the assist pressure is less than 0.02 MPa, the bending resilient force BF cannot be accepted. With this, the transfer substrate 14 is deformed at a dash from the curved shape to a flat shape to complete the peeling operation at a dash, and thus the minute convexo-concave pattern 12A tends to be damaged or deformed. On the other hand, if the assist pressure is more than 0.03 MPa to become large, the transfer substrate 14 is excessively bent, and damage or deformation of the minute convexo-concave pattern 12A tend to occur, and, at worst, the transfer substrate 14 itself is damaged.

Next, referring back to FIG. 5, if the assist pressure P has reached the predetermined pressure, a load measurement by the load cell 54 starts (step S-9), and the suction head 50 starts making a descending movement (step S-10). With this, the transfer substrate 14 is bent by the assist pressure accumulated in the pressurization space 42, and therefore the minute convexo-concave pattern 12A formed on the outer peripheral part of the transfer substrate 14 is peeled away from the mold 10 by the bending of the transfer substrate 14. With this, the first peeling process ends (refer to FIG. 6A). In this case, the moving speed of the suction head 50 is preferably 0.1 mm/second or less, and more preferably 0.05 mm/second or less. If the descending movement speed of the suction head 50 becomes faster than 0.05 mm/second or less, the transfer substrate 14 is abruptly bent, and therefore the minute convexo-concave pattern 12A on the outer peripheral part of the transfer substrate 14 to be peeled tends to be damaged or deformed.

Note that while the suction head 50 descends when the assist pressure reaches the predetermined pressure in the steps of FIG. 5, the suction head 50 may move as following by the bending force with which the transfer substrate 14 is bent without providing the moving and driving device 26 for moving the suction head 50, as described above.

Next, the descending movement stroke of the suction head 50 reaches the stroke in the first peeling process, the descending movement stops (step S-11), and the procedure goes to the next step S-12. In this case, after the descending movement of the suction head 50 stops, the procedure may immediately go to step S-12. Alternatively, the procedure may go to step S-12 after stopping or after a stop state continues for a predetermined time. With the stop for the predetermined time, the minute convexo-concave pattern 12A peelable in the first peeling process can be reliably peeled. Also, as a mechanism of stopping the descending movement of the suction head 50, a mechanical lock mechanism or a holding mechanism included in a driving system may be used.

At step S-12, air is gradually released from the pressurization space 42, and reduction of the assist pressure P for pressurizing the substrate back surface side of the transfer substrate 14 starts. Then, when the assist pressure P is gradually decreased and the bending resilient force BF becomes larger than the assist pressure P, the minute convexo-concave pattern 12A at the center part of the transfer substrate 14 not peeled in the first peeling process is peeled away from the mold 10 (refer to FIG. 6B). Reduction of the assist pressure ends when the pressure of the pressurization space 42 returns to atmospheric pressure (step S-13). With this, the second peeling process ends, and peeling of the mold 10 and the transfer substrate 14 is completed, and the mold 10 and the transfer substrate 14 are separated from each other.

Finally, the suction head 50 is retreated to a mechanical origin (step S-14), a peeling stop complete buzzer sounds, and the automatic peeling operation ends (step S-15).

In this second peeling process, since the assist pressure P with which the pressurization space 42 is pressurized is gradually decreased, the minute convexo-concave pattern 12A at the center part of the transfer substrate 14 is not peeled at a dash, is gradually peeled at a slow peeling speed with a small peel force. In particular, immediately before the second peeling process ends, only the minute convexo-concave pattern 12A at the peel final end (a center of the transfer substrate) is coupled to the mold 10. Therefore, if a large bending resilient force (peel force) is provided at a dash when peeling is completed, the minute convexo-concave pattern 12A at the peel final end is damaged. However, when being peeled gradually with peeling at a slow peeling speed with a small peel force, the minute convexo-concave pattern 12A at the peel final end can be reliably prevented from being damaged or deformed.

Therefore, as in the peeling of the minute convexo-concave pattern 12A at the peel final end, even if a portion in contact with the mold 10 is small and a peeling load tends to be concentrated on the minute convexo-concave pattern 12A, peeling can be performed so as not to damage or deform the minute convexo-concave pattern 12A.

Note that while the second peeling process is performed with the mold 10 being stopped in the present embodiment, the suction head may be cause to descend continuously while the assist pressure P is being gradually decreased to act the bending resilient force BF on the mold 10 and the transfer substrate 14. With this, in addition to the bending resilient force BF, a peel force F is provided in a direction in which the mold 10 and the transfer substrate 14 are peeled away from each other. Also in this case, the moving speed of the suction head is preferably at 0.1 mm/second or less, and more preferably at 0.05 mm/second or less.

Also, while the pressure of the substrate back side surface of the transfer substrate 14 is controlled based on the measurement value of the load cell 54 in the present embodiment, the pressurizing force may be controlled based on an elapsed time from the start of pressurization. Also, control may be made based on a movement amount of the mold 10 at the start of pressurization, or control may be made based on a bending amount of the transfer substrate 14 from the start of pressurization. In these cases, it is required to find a correlation by performing a preliminary test in advance to set conditions.

On the other hand, when the general tensile peeling process is selected (NO) at step S-6, a load measurement by the load cell 54 starts (step S-16), and also the suction head 50 is moved to descend (step S-17), thereby causing the mold 10 and the transfer substrate 14 to be pulled away from each other. Then, the mold 10 and the transfer substrate 14 are peeled at a dash. After the peeling ends, the descending movement of the suction head 50 stops (step S-18).

Example 1

Next, an example of the present invention is described, but this example is not meant to be restrictive.

In a peeling test, in nano imprint, the mold 10 for nano imprint having a minute convexo-concave pattern in a nano size was brought into close contact with the transfer substrate 14 coated with the resist layer 12 in advance, thereby transferring the minute convexo-concave pattern to the resist layer 12 of the transfer substrate 14. Then, operations were performed in the case of applying the peeling method according to the present embodiment to the peeling process after transfer and in the case of not applying the peeling method of the present embodiment, and the state of the minute convexo-concave pattern 12A after peeling was observed.

Figure 7:
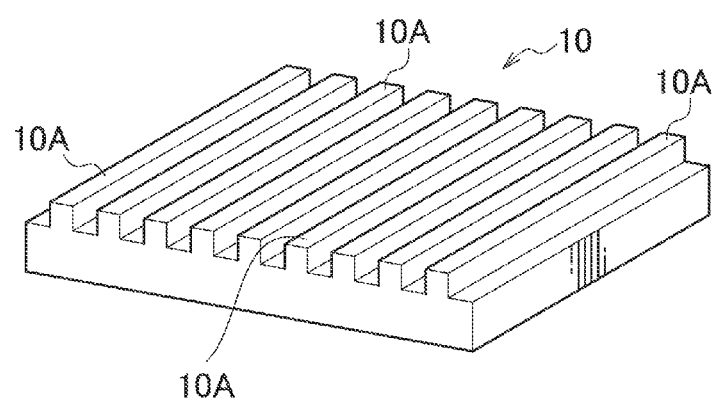
FIG. 7 is an explanatory diagram for describing a minute convexo-concave pattern of a mold for use in an example.

As the mold 10, a disk-shaped quartz having a thickness of 0.5 mm and a diameter of 4 inches (100 mm) was used, and, as illustrated in a schematic view (a perspective view) of FIG. 7, a pattern shape in which line-shaped minute convexo-concave patterns are parallel to each other was formed. Each minute convexo-concave pattern 10A has a section size with an L/S width of 2 μm and a height of 2 μm (an aspect ratio of 1) of a micro-texture. And, a surface where the minute convexo-concave patterns 10A were formed was coated with a release liquid. Note that while only a plurality of line-shaped minute convexo-concave patterns are drawn in FIG. 7, there are many pattern lines in a practical situation.

Also, as the transfer substrate 14, a disk-shaped quartz having a thickness of 0.5 mm and a diameter of 6 inches (150 mm) was used, and, as the resist layer 12, a UV (ultraviolet) curable resin was coated. Note that the conditions of the mold 10 and the transfer substrate 14 described above were the same between a comparative example and the example.

The work 20 as a combined body obtained by combining the mold 10 and the transfer substrate 14 together after transfer was set at the work holder 22 of FIG. 3. Then, general peeling steps S-1 to S-6 and steps S-16 to S-18 of FIG. 5 (the comparative example) and peeling steps S-1 to S-15 to which the present invention is applied (the example) were respectively performed.

Comparative Example

Figure 8:
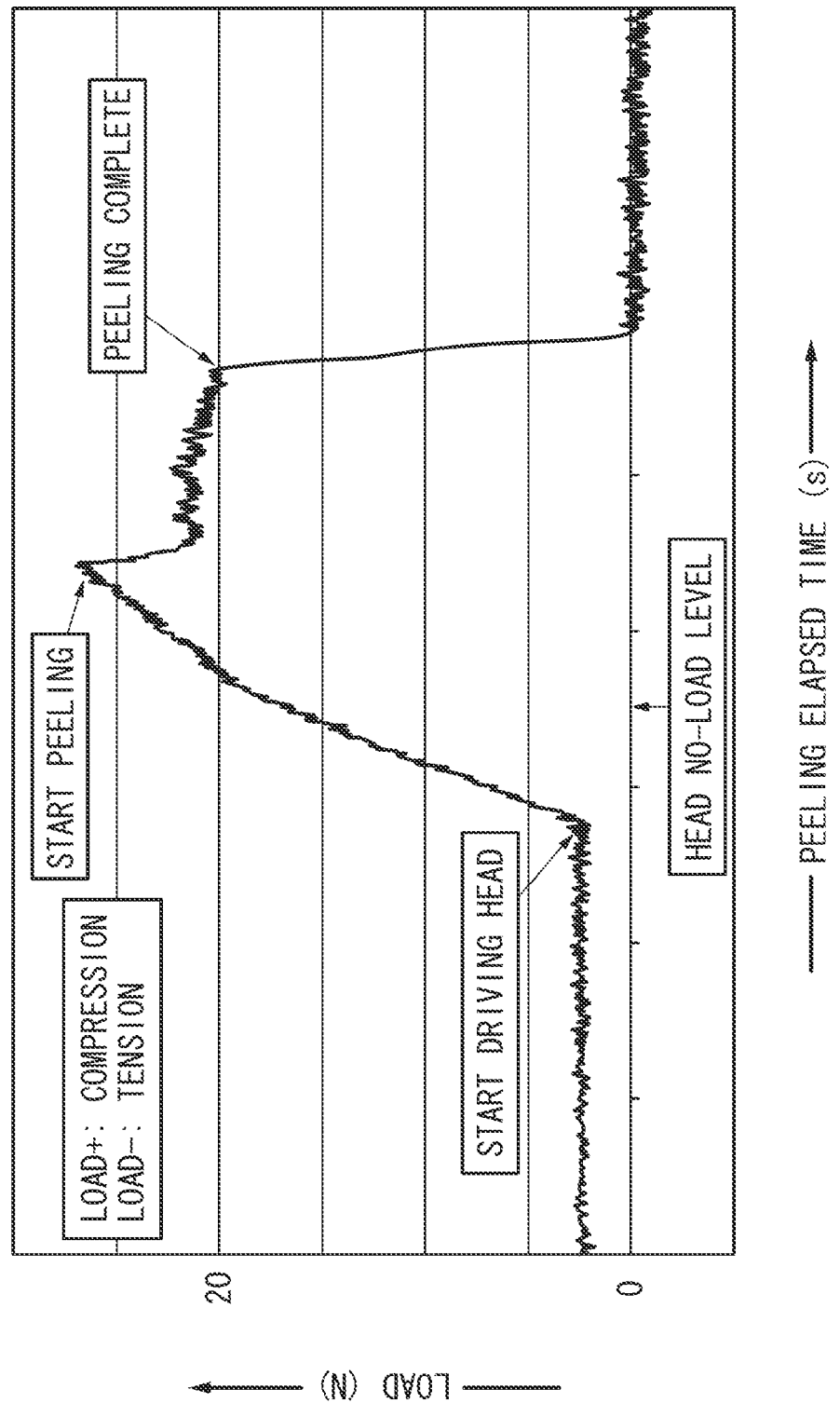
FIG. 8 is an explanatory diagram of changes in load in a conventional general peeling method (without assist pressurization)

FIG. 8 illustrates changes in load with time applied to the load cell 54 when the steps of the general tensile peeling method are performed. The horizontal axis represents an elapsed time from the start of peeling to the end thereof, and the vertical axis represents a peeling load measured by the load cell 54.

As illustrated in FIG. 8, driving of the suction head 50 starts and a descending movement starts. With this, the peel force is gradually increased. However, at this stage, the binding force between the mold 10 and the transfer substrate 14 is larger than the peel force, peeling does not start. Then, when the peel force becomes larger than the binding force, peeling gradually starts. When the peel force becomes larger than the binding force, the peeling speed is abruptly increased, the mold 10 and the transfer substrate 14 are peeled at a dash. With this, the peeling is completed, and the load gradually decreases to be zero. Also, the load in the final peeling process immediately before the peeling ends was 20 N, as can be seen from FIG. 8.

Example

Next, the peeling steps to which the present invention is applied are described.

In the example, the descending movement speed of the suction head 50 was set at 0.05 mm/second, and the heating condition of the suction head 50 was set at 46 degrees Celsius.

Also, the assist pressure (a supply pressure of compressed air) was set at 0.025 MPa, and the maximum bending amount was set at 1 mm. For the operation of reducing the assist pressure, using an electro-pneumatic conversion regulator is better in view of reproducibility in a practical situation. In the present example, however, the operation was performed by manually rotating a regulator valve at a predetermined speed.

Figure 9:
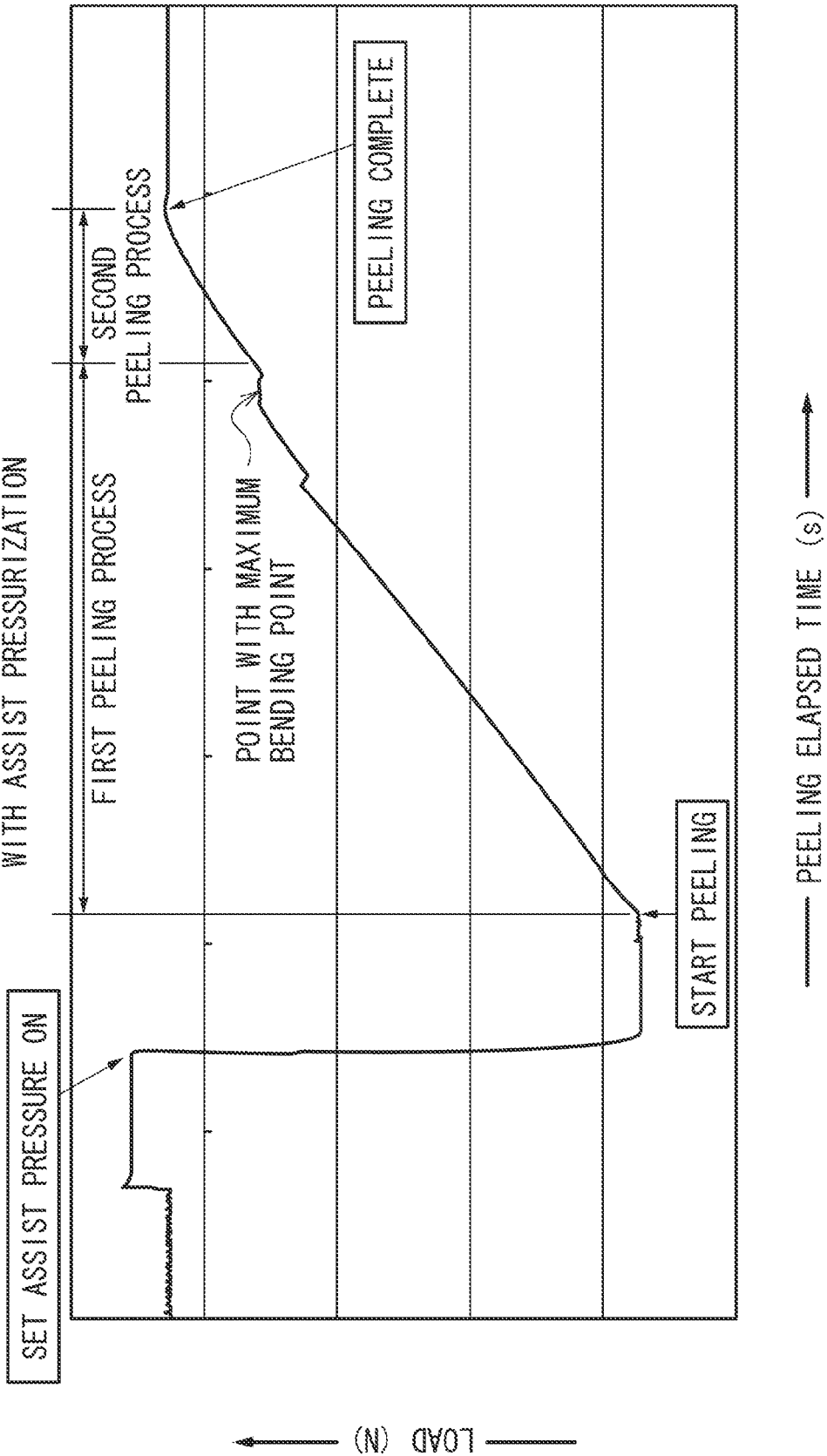
FIG. 9 is a peel force waveform analysis diagram in the peeling method in the present invention (with assist pressurization)
Figure 10:
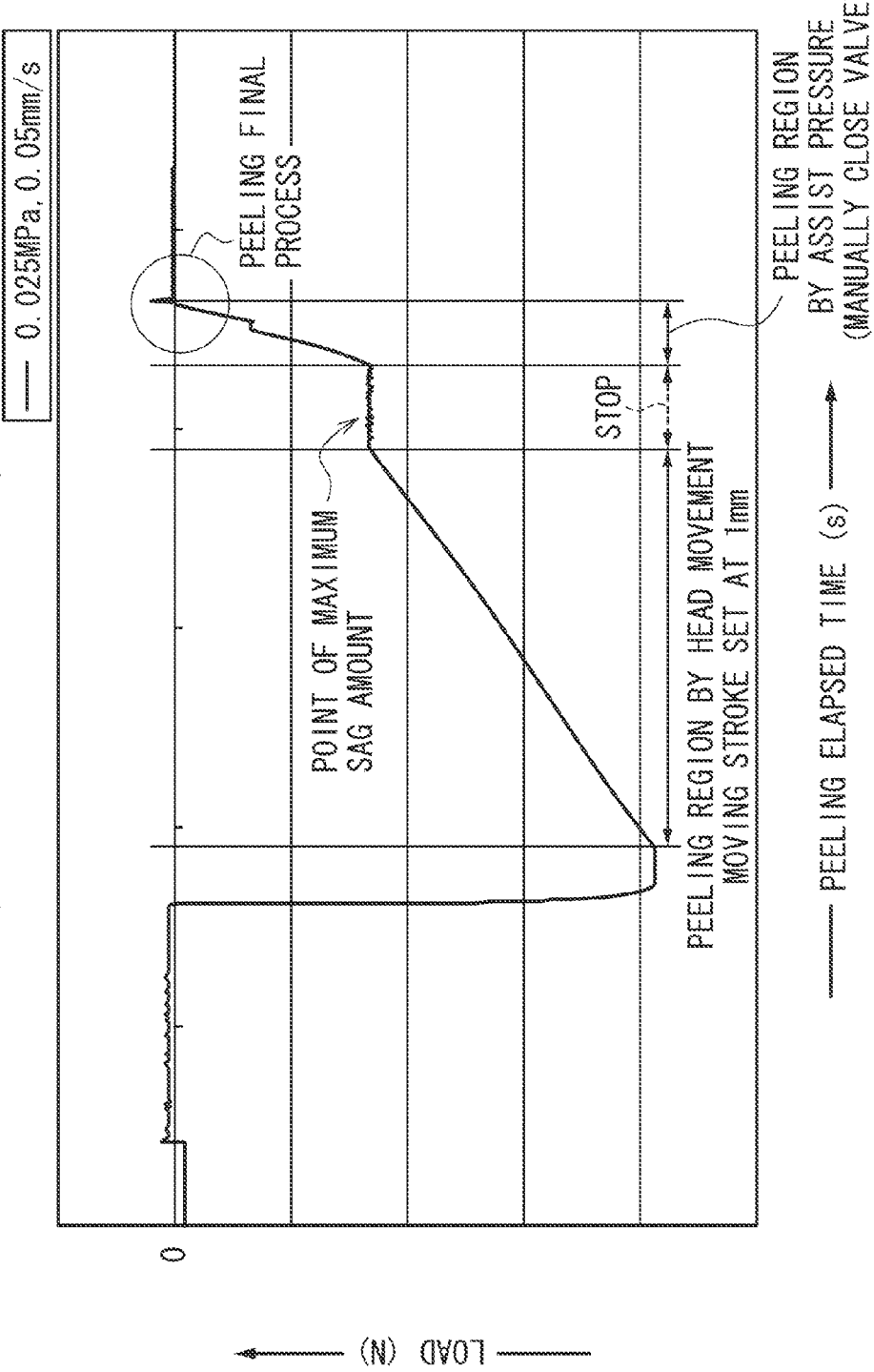
FIG. 10 is an explanatory diagram of changes in load in the peeling method in the present invention (with assist pressurization)

FIG. 9 is a peel force waveform analysis diagram with assist pressurization, and FIG. 10 is a diagram of change in load actually measured by the load cell 54. The horizontal axis represents an elapsed time from the start of peeling to the end thereof, and the vertical axis represents a peeling load measured by the load cell 54.

As illustrated in FIG. 9 and FIG. 10, the load is abruptly decreased after the assist pressure is applied, because the pressurization space 42 of the work holder 22 is pressurized to cause the work 20 to press the load cell 54, thereby applying a compressed load (a load oriented downward in FIG. 10) to the load cell 54. After the assist pressure has reached the predetermined pressure (the pressure for achieving the maximum bending amount), when the suction head 50 is moved to descend, the transfer substrate 14 is bent in a curved shape, and the first peeling process starts with this bending. Specifically, with the bending of the transfer substrate 14, the minute convexo-concave pattern 12A on the outer peripheral part transfer substrate 14 is peeled. Here, since a force causing the outer peripheral part of the transfer substrate 14 to be peeled away from the mold 10 is applied to the load cell 54, a tensile load (a load oriented upward in FIG. 10) is applied to the load cell 54. At the time when the bending amount of the transfer substrate 14 reaches the maximum bending amount L, the descending movement of the suction head 50 stops. As illustrated in FIG. 9 and FIG. 10, a portion of the upward load once flattened represents a point of the maximum bending amount L.

Next, when the assist pressure is gradually decreased, the bending resilient force BF is applied to the transfer substrate 14. With this, the second peeling process starts, and the minute convexo-concave pattern 12A at the center part of the transfer substrate 14 not peeled in the first peeling process is peeled away from the mold 10 with a small peel force at a slow peeling speed. With this, the minute convexo-concave pattern 12A transferred to the resist layer 12 of the transfer substrate 14 can be effectively prevented from being damaged when the mold 10 and the transfer substrate 14 are peeled.

Figure 11:
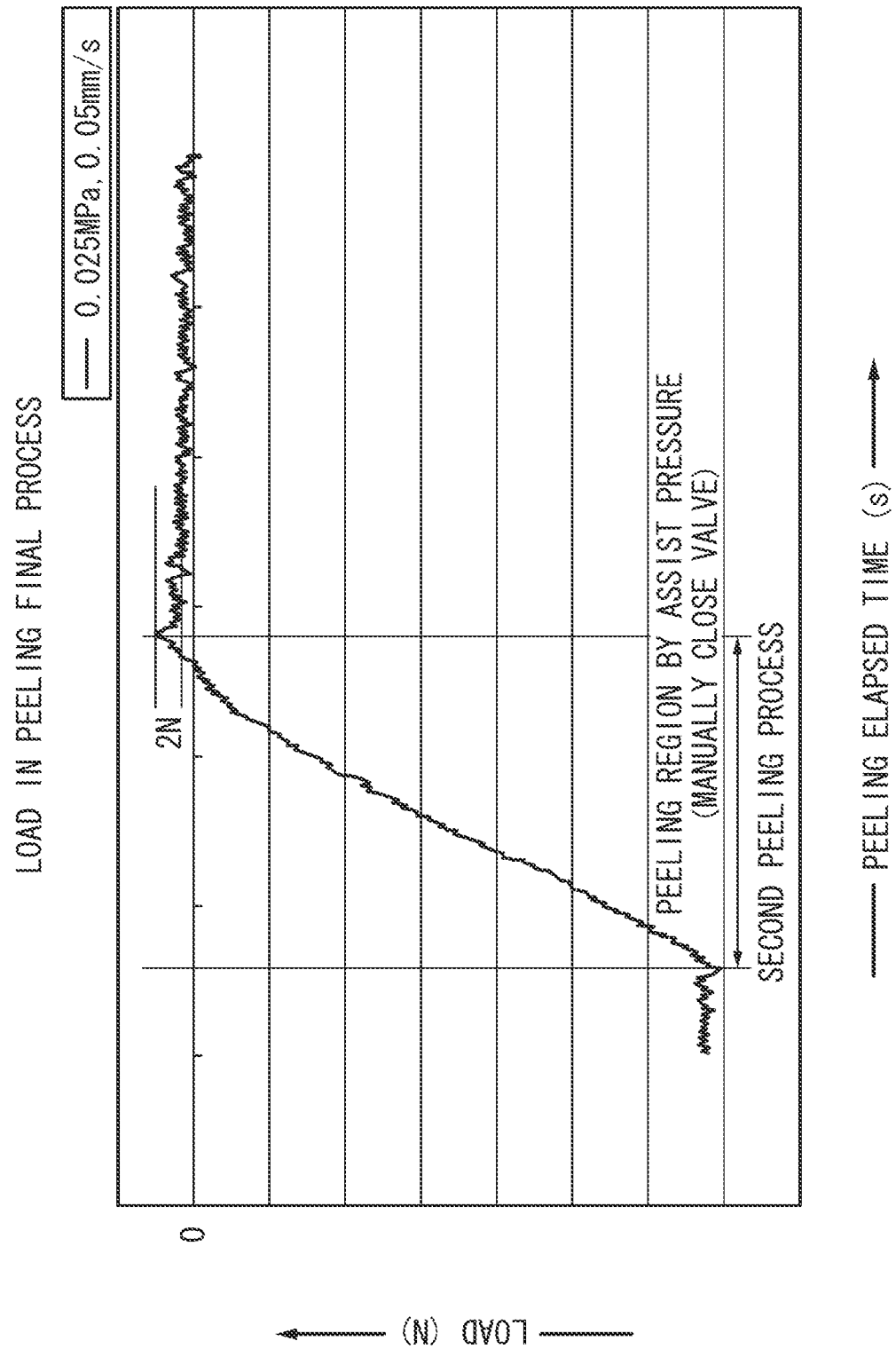
FIG. 11 is an explanatory diagram for describing a load behavior in a final peeling process in the peeling method in the present invention (with assist pressurization)

FIG. 11 illustrates an enlarged load behavior in the final peeling process immediately before the second peeling process is completed in FIG. 10, in which a portion surrounded by a circle in FIG. 10 is enlarged. As can be seen from FIG. 11, tensile load applied to the minute convexo-concave pattern 12A at the peel final end (the center of the transfer substrate) peeled in the final peeling process was 2 N. As such, in the peeling method according to the present embodiment, the tensile load in the final peeling process in the general tensile peeling method illustrated in FIG. 8 (20 N) is decreased to $\frac{1}{10}$.

[Comparison in Damage of Minute Convexo-Concave Pattern after Peeling]

Figure 12A:
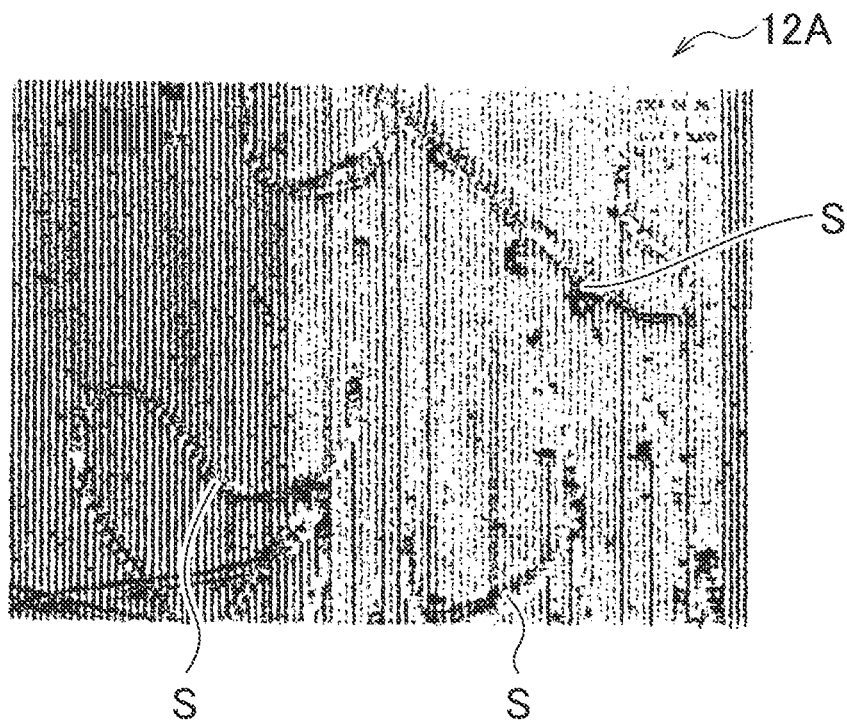
FIG. 12A is an explanatory diagram for describing the state of the minute convexo-concave pattern of a transfer substrate peeled with the conventional general peeling method.
Figure 12B:
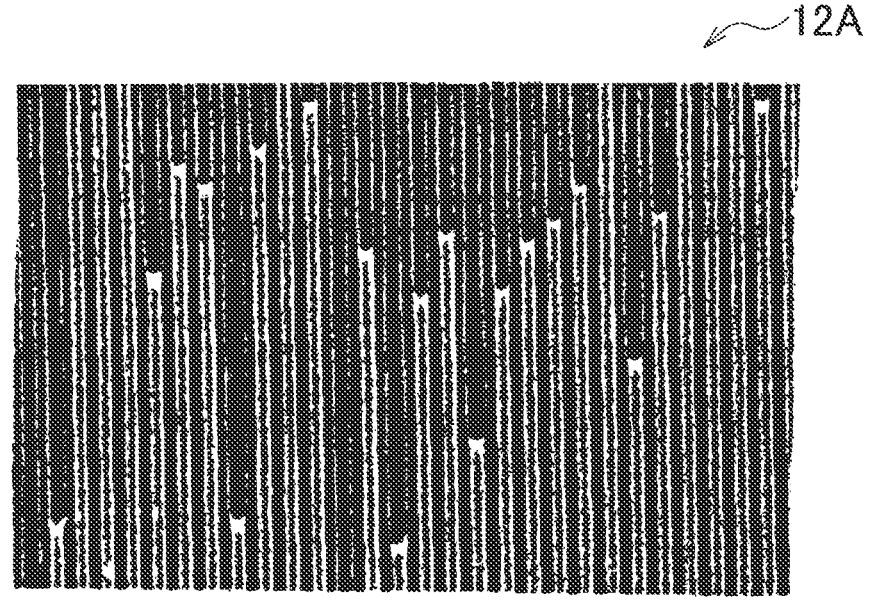
FIG. 12B is an explanatory diagram for describing the state of the minute convexo-concave pattern of the transfer substrate peeled with the conventional general peeling method.

FIG. 12A and FIG. 12B illustrate SEM (scanning electron microscope) photographs obtained by capturing the minute convexo-concave pattern 12A of the transfer substrate 14 peeled with the general peeling method described above by using an electron microscope.

As can be seen from FIG. 12A, in the minute convexo-concave pattern 12A, projected lines formed in a line shape are partially stripped off as whisker-like parts S. When the sagging whisker-like parts S are removed and an observation is performed with an increased magnifying power, it can be found as illustrated in FIG. 12B, a portion where a projected line is present (a white portion) and a portion where the line is stripped off to disappear (a black portion) are present.

Figure 13:
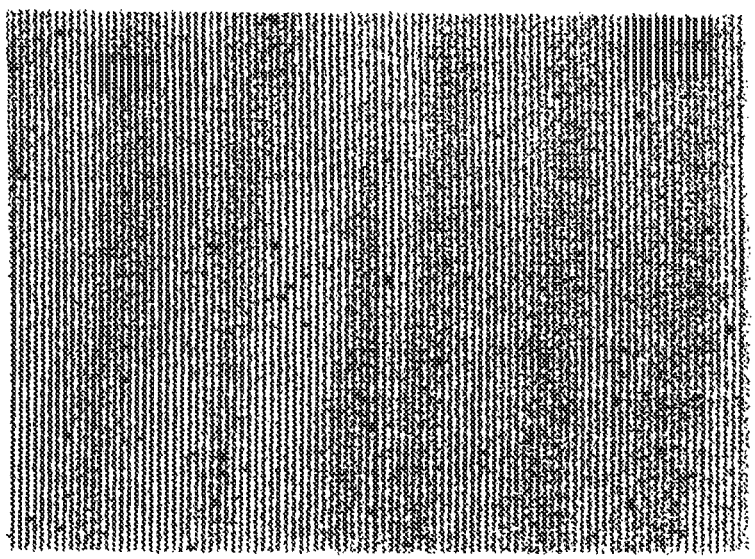
FIG. 13 is an explanatory diagram for describing the state of the minute convexo-concave pattern of the transfer substrate peeled with the peeling method in the present invention.

By contrast, FIG. 13 illustrates the minute convexo-concave pattern 12A of the transfer substrate 14 peeled with the peeling method of the present invention, which can be compared with that of FIG. 12A. As can be seen from FIG. 13, a projecting line in a line shape is not peeled at all, and the minute convexo-concave pattern 12A has been precisely transferred.

REFERENCE SIGNS LIST

10 . . . mold, 12 . . . resist layer, 14 . . . transfer substrate, 16 . . . substrate, 20 . . . combined body (work), 21 . . . peeling device, 22 . . . work holder, 24 . . . pressurizing device, 26 . . . moving and driving device, 30 . . . device frame, 32 . . . strut, 34 . . . support plate, 36 . . . upper plate, 38 . . . lower plate, 40 . . . O ring, 42 . . . pressurizing space, 44 . . . piping, 45 . . . pressure control mechanism, 46 . . . electro-pneumatic conversion regulator, 47 . . . compressor, 48 . . . solenoid valve, 50 . . . suction head, 52 . . . ascent/descent machine, 53 . . . suction control mechanism, 56 . . . temperature control mechanism, 57 . . . movement control mechanism, 58 . . . vacuum pump, 60 . . . solenoid valve, 62 . . . pressure sensor, 64 . . . driver, 66 . . . touch panel, 68 . . . load cell controller

The invention claimed is:

1. A minute convexo-concave pattern forming method comprising:
   a transferring step of transferring a minute convexo-concave pattern of a mold to a resist layer of a transfer substrate and curing the transferred minute convexo-concave pattern; and
   a peeling step of, after the transferred minute convexo-concave pattern are cured, peeling apart the transfer substrate and the mold,
   the peeling step including:
   a first peeling step of pressurizing a substrate back surface side of the transfer substrate with a peripheral part of the transfer substrate being fixed to bend the transfer substrate in a curved shape, and starting peeling of the transfer substrate and the mold with a bending of the transfer substrate; and a second peeling step of peeling a part of the minute convexo-concave pattern of the transfer substrate not peeled in the first peeling step by gradually decreasing a pressure for a pressurization so as to restore an original shape of the transfer substrate, wherein, in the first and second peeling steps, a load applied to the transfer substrate is measured, and the pressure on the substrate back surface side is controlled based on the measured load.

2. The minute convexo-concave pattern forming method according to claim 1, wherein, in the first peeling step, the transfer substrate is bent to an amount less than a maximum bending amount.

3. The minute convexo-concave pattern forming method according to claim 1, wherein, in the first peeling step, the mold is moved according to the bending of the transfer substrate in a direction in which the mold goes away from the transfer substrate.

4. The minute convexo-concave pattern forming method according to claim 1, wherein, in the second peeling step, the peeling is performed with the mold being fixed so as not to move while a pressurizing force on the substrate back surface side is being gradually decreased.

5. The minute convexo-concave pattern forming method according to claim 3, wherein, in the second peeling step, the mold is peeled by gradually decreasing a pressurizing force on the substrate back surface side while the mold is being moved in the direction in which the mold goes away from the transfer substrate continuously from a movement in the first peeling step.

6. The minute convexo-concave pattern forming method according to claim 3, wherein, in the second peeling step, the mold is peeled with a pressurizing pressure on the substrate back surface side being kept, while the mold is being moved in the direction in which the mold goes away from the transfer substrate continuously from a movement in the first peeling step.

7. The minute convexo-concave pattern forming method according to claim 1, wherein the pressure on the substrate back surface side is controlled based on an elapsed time from a start of the pressurization on the substrate back surface side of the transfer substrate.

8. The minute convexo-concave pattern forming method according to claim 1, wherein the pressure on the substrate back surface side is controlled based on a movement amount of the mold from a start of the pressurization on the substrate back surface side of the transfer substrate.

9. The minute convexo-concave pattern forming method according to claim 1, wherein the pressure on the substrate back surface side is controlled based on a bending amount of the transfer substrate from a start of the pressurization on the substrate back surface side of the transfer substrate.

10. A minute convexo-concave pattern forming apparatus comprising a peeling device configured to, after transferring and curing a minute convexo-concave pattern of a mold to a resist layer of a transfer substrate, peel apart the transfer substrate and the mold, the peeling device including:

a peripheral part fixing member configured to fix a peripheral part of the transfer substrate;

a pressurizing part configured to pressurize a substrate back surface side of the transfer substrate with the peripheral part of the transfer substrate being fixed to bend the transfer substrate in a curved shape;

a pressure control part configured to decrease a pressure for a pressurization so as to restore an original shape of the transfer substrate gradually; and a load sensor configured to measure a load applied to the transfer substrate.

11. The minute convexo-concave pattern forming apparatus according to claim 10, further comprising a moving and driving part configured to move the mold in a direction in which the mold goes away from the transfer substrate.

12. The minute convexo-concave pattern forming apparatus according to claim 11, wherein the moving and driving part includes a lock mechanism configured to lock a movement of the mold.

13. A manufacturing method of a transfer substrate for manufacturing the transfer substrate, comprising:

by using the minute convexo-concave pattern forming method according to claim 1, transferring the minute convexo-concave pattern of the mold to the transfer substrate; and peeling the mold away from the transfer substrate.

14. The minute convexo-concave pattern forming method according to claim 2, wherein, in the second peeling step, the peeling is performed with the mold being fixed so as not to move while a pressurizing force on the substrate back surface side is being gradually decreased.

15. The minute convexo-concave pattern forming method according to claim 3, wherein, in the second peeling step, the peeling is performed with the mold being fixed so as not to move while a pressurizing force on the substrate back surface side is being gradually decreased.

* * * * *